(12) United States Patent
Izuoka et al.

(10) Patent No.: US 12,581,964 B2
(45) Date of Patent: Mar. 17, 2026

(54) LEAD FRAME, SEMICONDUCTOR DEVICE, AND LEAD FRAME MANUFACTURING METHOD

(71) Applicant: SHINKO ELECTRIC INDUSTRIES CO., LTD., Nagano (JP)

(72) Inventors: Jun Izuoka, Nagano (JP); Koichi Ishida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 572 days.

(21) Appl. No.: 17/854,943

(22) Filed: Jun. 30, 2022

(65) Prior Publication Data

US 2023/0005827 A1     Jan. 5, 2023

(30) Foreign Application Priority Data

Jul. 5, 2021     (JP) ................................. 2021-111664

(51) Int. Cl.
 *H01L 23/495* (2006.01)
 *H01L 21/48* (2006.01)
 *H01L 23/00* (2006.01)
 *H01L 23/31* (2006.01)
 *H01L 23/367* (2006.01)

(52) U.S. Cl.
 CPC .... *H01L 23/49568* (2013.01); *H01L 21/4875* (2013.01); *H01L 23/3107* (2013.01); *H01L 23/367* (2013.01); *H01L 23/49503* (2013.01); *H01L 24/48* (2013.01); *H01L 2224/48151* (2013.01)

(58) Field of Classification Search
 CPC ......... H01L 23/49568; H01L 23/49541; H01L 23/49548
 See application file for complete search history.

(56) References Cited

U.S. PATENT DOCUMENTS

| | | | | |
|---|---|---|---|---|
| 5,394,607 A | * | 3/1995 | Chiu | ................. H01L 23/49541 |
| | | | | 257/E23.092 |
| 2017/0312853 A1 | * | 11/2017 | Kabelitz | .............. B23K 26/323 |
| 2021/0134754 A1 | | 5/2021 | Tsukada et al. | |

FOREIGN PATENT DOCUMENTS

| | | |
|---|---|---|
| CN | 101673722 A | 3/2010 |
| CN | 112750796 A | 5/2021 |
| JP | 52-42067 U | 3/1977 |

(Continued)

OTHER PUBLICATIONS

Decision to Grant a Patent issued Apr. 1, 2025 in corresponding Japanese application No. 2021-111664; English translation included (3 pages).

(Continued)

*Primary Examiner* — David A Zarneke

(74) *Attorney, Agent, or Firm* — Rankin, Hill & Clark LLP

(57) ABSTRACT

A lead frame includes a support portion that has one end on which a first part and a second part that has a smaller thickness than the first part are arranged, a lead, and a heat sink that is welded to the support portion in the second part. A method of manufacturing the lead frame includes forming, from a metal plate, a frame member that includes a support portion and a lead, where the support portion has one end on which a first part and a second part that has a smaller thickness than the first part are arranged, and welding a heat sink to the support portion in the second part.

11 Claims, 14 Drawing Sheets

(56)        References Cited

FOREIGN PATENT DOCUMENTS

| | | | |
|---|---|---|---|
| JP | 63-130290 A | | 6/1988 |
| JP | S63130290 A | * | 6/1988 |
| JP | 3-155487 A | | 7/1991 |
| JP | H05-183068 A | | 7/1993 |
| JP | H5-190720 A | | 7/1993 |
| JP | 7-7125 A | | 1/1995 |
| JP | H0794845 A | * | 4/1995 |
| JP | H7-226478 A | | 8/1995 |
| JP | H08-162590 | | 6/1996 |
| JP | H10-144852 | | 5/1998 |
| JP | H11215652 A | * | 8/1999 |
| JP | 2012252935 A | * | 12/2012 |

OTHER PUBLICATIONS

Japanese Office Action dated Dec. 24, 2024, Application No. 2021-111664; English translation included; 4 pages.
Chinese Office Action Corresponding to CN Application No. 202210766109.0 dated Jan. 16, 2026, 17 pages.

* cited by examiner

LEAD FRAME, SEMICONDUCTOR DEVICE, AND LEAD FRAME MANUFACTURING METHOD

CROSS-REFERENCE TO RELATED APPLICATION

This application is based upon and claims the benefit of priority of the prior Japanese Patent Application No. 2021-111664, filed on Jul. 5, 2021, the entire contents of which are incorporated herein by reference.

FIELD

The embodiments discussed herein are related to a lead frame, a semiconductor device, and a lead frame manufacturing method.

BACKGROUND

In recent years, for example, a semiconductor device in which a semiconductor element, such as an integrated circuit (IC) chip, is mounted on a lead frame that is made of metal is known. Specifically, for example, a semiconductor element is mounted on a sheet-shaped die pad that is arranged in the center of a lead frame, and the semiconductor element is connected, by wire bonding, to a plurality of leads that are arranged around the die pad, for example. Further, in some cases, a semiconductor device may be formed by encapsulating a semiconductor element mounted on a lead frame by resin, such as epoxy resin, for example.

As the lead frame as described above, a lead frame that is constructed by bonding a heat sink to a frame member including a plurality of leads without arranging a die pad is known. Specifically, in some cases, a heat sink that has a larger plate thickness than a frame member that is formed of a thin plate made of metal may be bonded in the center of the frame member by, for example, welding, and a semiconductor element may be directly mounted on the heat sink. With this configuration, it is possible to efficiently dissipate heat that is generated by the semiconductor element.

Patent Literature 1: Japanese Laid-open Patent Publication No. H08-162590

Patent Literature 2: Japanese Laid-open Patent Publication No. H10-144852

However, when the heat sink is bonded to the frame member, there is a problem in that the frame member or the heat sink may be deformed or damaged due to the heat. In other words, when fine components, such as the frame member and the heat sink, are bonded together, in some cases, laser welding may be used, but due to long time application of laser to the frame member and the heat sink to be bonded together, heat may be transmitted even to the vicinity of a bonded portion and thermal deformation or the like may occur. In particular, when laser welding is performed in a portion in which the frame member and the heat sink overlap with each other, laser may be applied so as to penetrate through the frame member that is formed of a thin plate, so that the frame member may be deformed or the heat sink may be damaged in the vicinity of the bonded portion.

In contrast, if laser output is suppressed or the laser application time is reduced in order to prevent the deformation and the damage as described above, it becomes difficult to fully weld the frame member and the heat sink together, so that quality of the lead frame and the semiconductor device is reduced.

SUMMARY

According to an aspect of an embodiment, a lead frame includes a support portion, a lead and a heat sink. The support portion has one end on which a first part and a second part that has a smaller thickness than the first part are arranged. The heat sink is welded to the support portion in the second part.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of a lead frame, a semiconductor device, and a lead frame manufacturing method disclosed in the present application will be described in detail below with reference to the drawings. The present invention is not limited by the embodiments below.

Figure 1A:
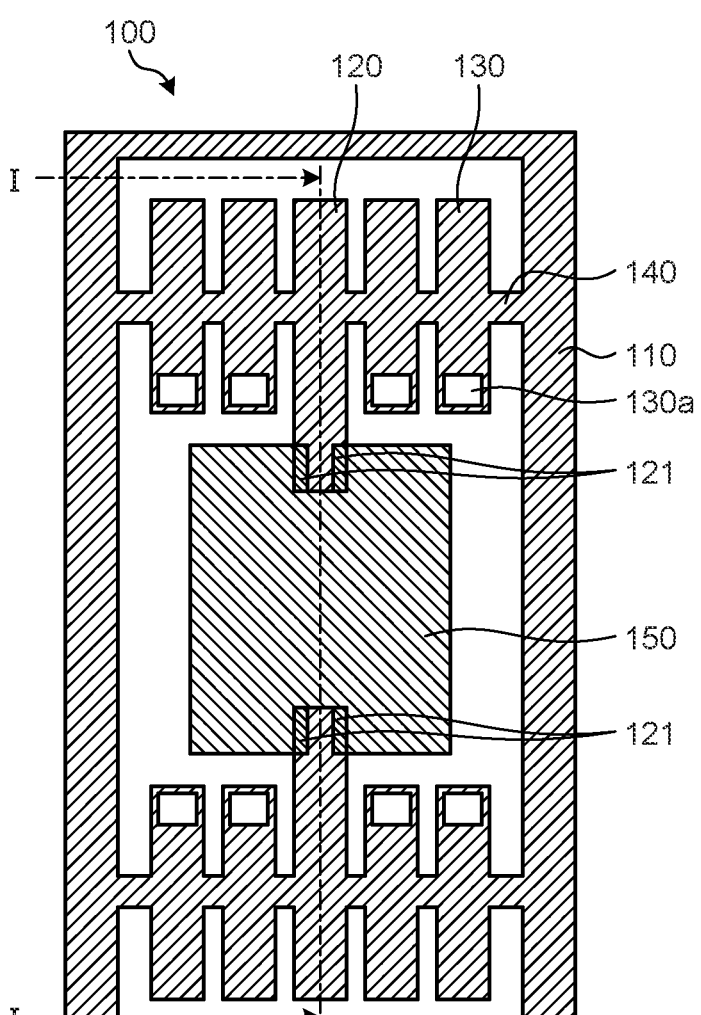
FIGS. 1A and 1B are diagrams illustrating a configuration of a lead frame according to one embodiment.
Figure 1B:
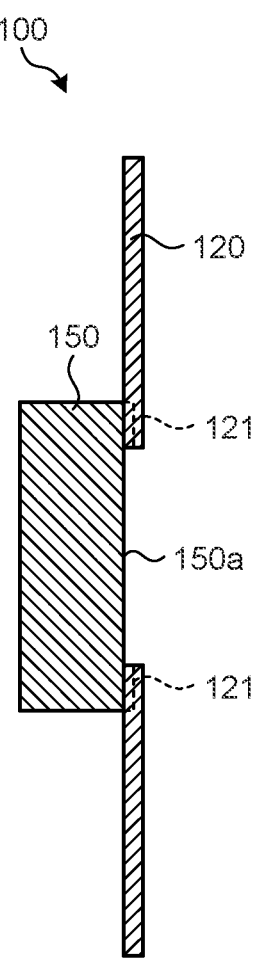

FIGS. 1A and 1B are diagrams illustrating a configuration of a lead frame 100 according to one embodiment. FIG. 1A is a plan view of the lead frame 100, and FIG. 1B is a cross-sectional view taken along a line I-I in FIG. 1A.

The lead frame 100 has a configuration in which a heat sink 150 is bonded to a frame member that includes a frame 110, support bars 120, leads 130, and tie bars 140. The frame member is formed of a plate member that is made of metal, such as copper or a copper alloy, and that has a thickness of about 0.1 to 0.25 millimeter (mm), for example. In contrast, the heat sink 150 is a metal plate that has a larger plate thickness, such as 1 (mm) or more, than the plate member used to form the frame member, and that is made of copper, a copper alloy, or the like, for example.

The frame 110 defines an outer circumference of the single lead frame 100, and supports the support bars 120 and the plurality of leads 130 via the tie bars 140. When the lead frame 100 is manufactured, an assembly of lead frames is manufactured in which the plurality of lead frames 100 are connected via the frames 110. Further, after a semiconductor chip is mounted on the lead frame 100 and resin encapsulating is performed, the tie bars 140 between the plurality of leads 130 and between the leads 130 and the support bars 120 are cut. Subsequently, a portion including the support bars 120, the plurality of leads 130, and the heat sink 150 are cut off from the frame 110, so that an individual piece of semiconductor device is obtained. The support bars 120 is a narrow strip of the metal plate having one end and the other end. The leads 130 is a narrow strip of the metal plate having one end and the other end.

The support bars 120 are a pair of support portions that extend, in a center of the lead frame 100 in a short-side direction, from both ends of the lead frame 100 in a longitudinal direction to a center of the lead frame 100, and support the heat sink 150 at end portions located in the center of the lead frame 100 (hereinafter, the end portions will be referred to as "central-side end portions"). In other words, one end of the support bars 120 as a pair overlapping with the heat sink 150 serve as welding portions, and a mounting surface 150a of the heat sink 150 for mounting a semiconductor chip is welded to thin thickness portions 121 that are formed in the welding portions.

The thin thickness portions 121 are portions that have smaller plate thicknesses than other portions in the welding portions that are located in the central-side end portions of the support bars 120. In the example illustrated in FIGS. 1A and 1B, the thin thickness portions 121 are formed on both ends of each of the welding portions in a width direction, and the plate thicknesses of the thin thickness portions 121 are smaller than a central portion that is sandwiched between the thin thickness portions 121.

Figure 2:
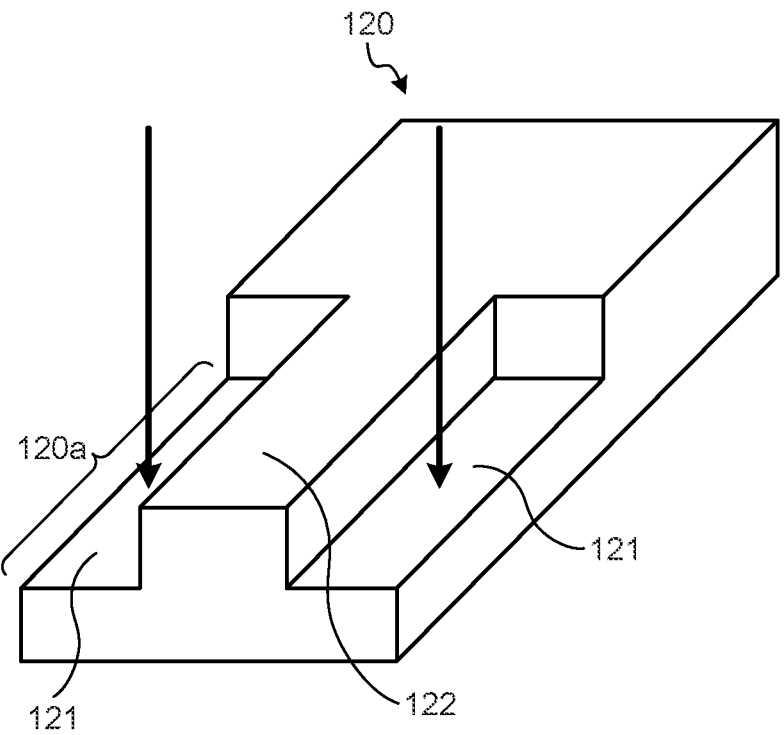
FIG. 2 is a perspective view illustrating a configuration of a welding portion.

FIG. 2 is a perspective view illustrating a configuration of a welding portion 120a located in the central-side end portion of each of the support bars 120.

The welding portion 120a is located in a range of about 1 mm from an end on a central side of the support bar 120, and includes the thin thickness portions 121 and a residual portion 122. The support bars 120 overlap with the heat sink 150 in the welding portions 120a, and are welded to the mounting surface 150a of the heat sink 150.

The thin thickness portions 121 are portions that are formed by reducing thicknesses of both ends of the welding portion 120a in the width direction, and that have smaller plate thicknesses than the residual portion 122. The thin thickness portions 121 are formed by, for example, half etching, press forging, or the like. As indicated by straight arrows in FIG. 2, for example, laser, such as fiber laser, is applied to the thin thickness portions 121, and the support bars 120 and the heat sink 150 are welded together in the welding portions 120a. A welding position in the thin thickness portions 121 at which the laser is applied is not limited to a single position, but may be a plurality of positions. The thin thickness portions 121 is formed of a recess on the welding portions 120a formed by, for example, half etching, press forging, or the like from an upper surface of the welding portions 120a. The welding portions 120a is one end of the support bars 120. A lower surface of the welding portions 120a is a flat surface. The surface of the welding portion 120a opposite to the heat sink 105 is the flat surface compared to the surface of the welding portions 120a at which the laser is applied.

The residual portion 122 is a remaining portion for which a thickness is not reduced in the welding portion 120a. The residual portion 122 has the same plate thickness as a portion of the support bar 120 other than the welding portion 120a. In FIG. 2, the residual portion 122 remains in the center of the welding portion 120a, and the thin thickness portions 121 are formed on both sides of the residual portion 122; therefore, a cross-sectional shape of the welding portion 120a is a convex shape.

Figure 3:
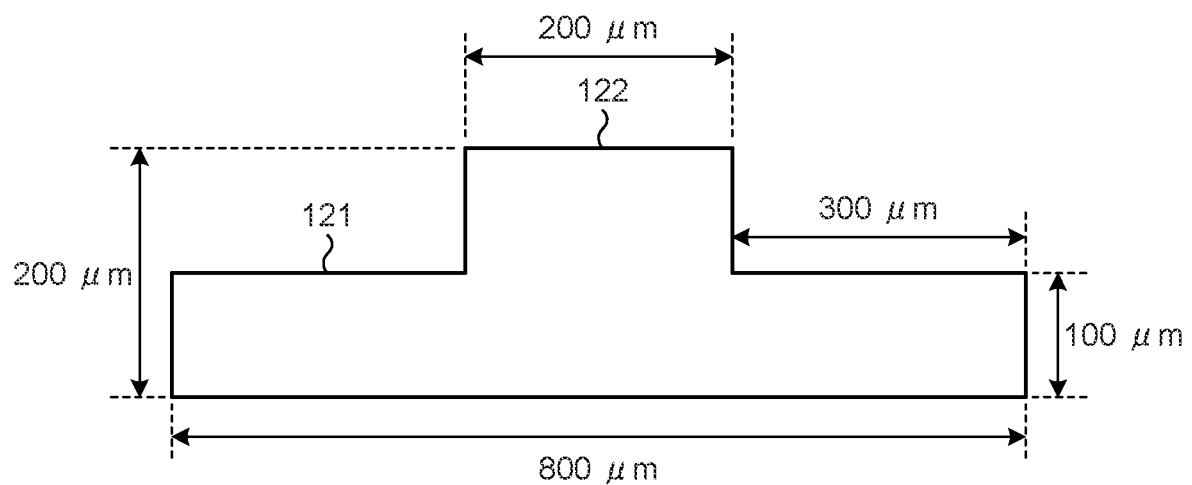
FIG. 3 is a diagram illustrating a specific example of a cross section of the welding portion.

FIG. 3 is a diagram illustrating a specific example of a cross section of the welding portion 120a. As illustrated in FIG. 3, the support bar 120 has a width of, for example, about 800 micrometers (μm), and a plate thickness of the support bar 120 including the residual portion 122 is about 200 μm.

A width of the residual portion 122 in the center is, for example, about 200 μm, and a width of each of the thin thickness portions 121 on the both sides of the residual portion 122 is, for example, about 300 μm. Further, a plate thickness of each of the thin thickness portions 121 is about 100 μm.

Figure 4A:
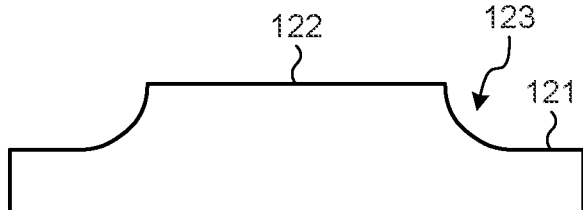
FIGS. 4A, 4B and 4C are diagrams illustrating a specific example of a cross-sectional shape of the welding portion.
Figure 4B:
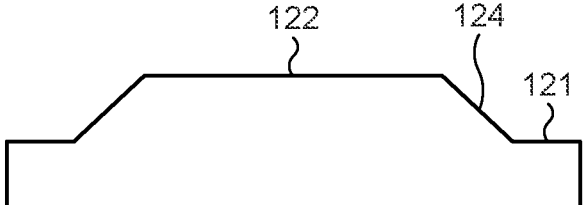
Figure 4C:
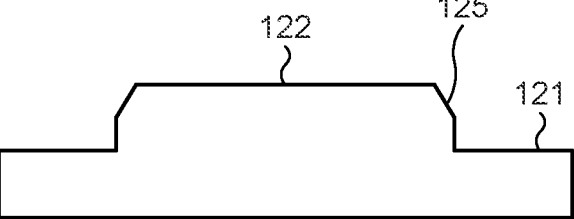

Meanwhile, the cross-sectional shape of the welding portion 120a need not always be a convex shape. For example, boundaries between each of the thin thickness portions 121 and the residual portion 122 may be formed as curved surfaces 123 as illustrated in FIG. 4A, or boundaries between each of the thin thickness portions 121 and the residual portion 122 may be formed as slopes 124 as illustrated in FIG. 4B. Further, for example, it may be possible to form slopes 125 by chamfering an upper surface of the residual portion 122 as illustrated in FIG. 4C.

As in the cross-sectional shapes as described above, if the residual portion 122 is located in the center of the welding portion 120a and the thin thickness portions 121 are formed on the both sides of the residual portion 122, a distance between the two thin thickness portions 121 is relatively increased. As a result, a distance between the welding portions to which the laser is applied is increased, so that it is possible to prevent heat of the laser from being concentrated in a narrow range and it is possible to prevent thermal deformation of the support bars 120 and the heat sink 150.

Referring back to FIGS. 1A and 1B, the leads 130 are terminals that extend parallel to the support bars 120, and that, when a semiconductor chip is mounted on the lead frame 100, electrically connect the semiconductor chip and external components. The leads 130 are shorter in length than the support bars 120, and central-side end portions of the leads 130 do not overlap with the heat sink 150. Further, plating layers are formed on surfaces of the central-side end portions of the leads 130 at a far side of the heat sink 150, and when the semiconductor chip is mounted on the lead frame 100, the semiconductor chip is connected to the plating layers by wire bonding.

The heat sink 150 is a plate member that is made of copper and that is bonded to the central-side end portions of the support bars 120 as a pair. A surface of the heat sink 150 that is bonded to the support bars 120 is the mounting surface 150a on which the semiconductor chip is mounted. The heat sink 150 dissipates heat generated by the semiconductor chip mounted on the mounting surface 150a, from a surface opposite to the mounting surface 150a. Therefore, the surface opposite to the mounting surface 150a is exposed from mold resin even when the semiconductor chip is encapsulated by the mold resin. The surface of the heat sink 150 opposite to the support bars 120 is a flat surface.

Figure 5:
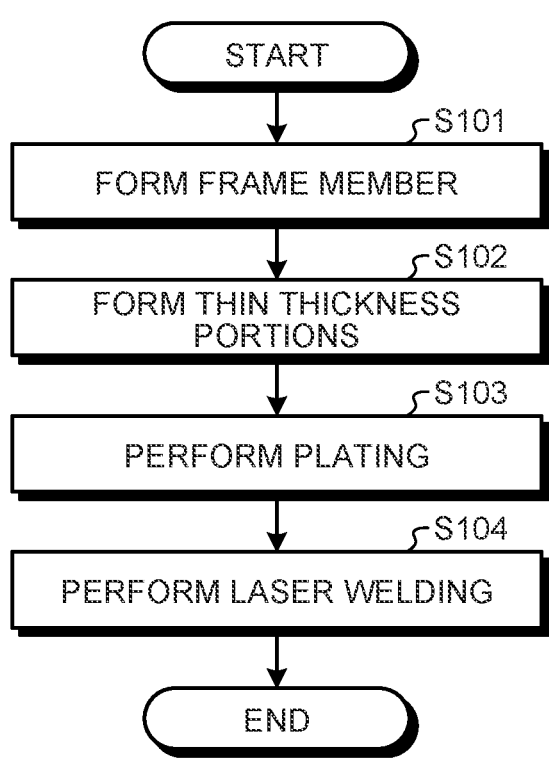
FIG. 5 is a flow diagram illustrating a lead frame manufacturing method.

A method of manufacturing the lead frame 100 configured as above will be described below with reference to a flow diagram illustrated in FIG. 5.

Figure 6:
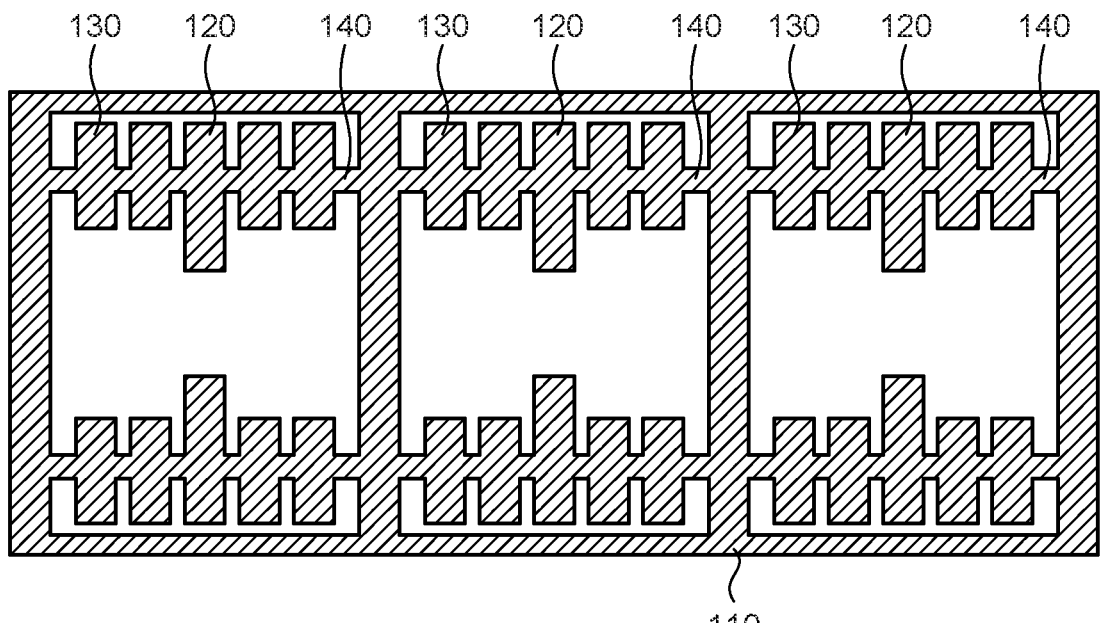
FIG. 6 is a diagram illustrating a specific example of a molding process.

First, for example, a frame member is formed by performing pressing, etching, or the like on a metal plate that is made of copper, a copper alloy, or the like and that has a thickness of about 0.1 to 0.25 mm (Step S101). Specifically, as illustrated in FIG. 6 for example, the support bars 120, the plurality of leads 130, and the tie bars 140 are formed in each of areas enclosed by the frames 110.

Figure 7:
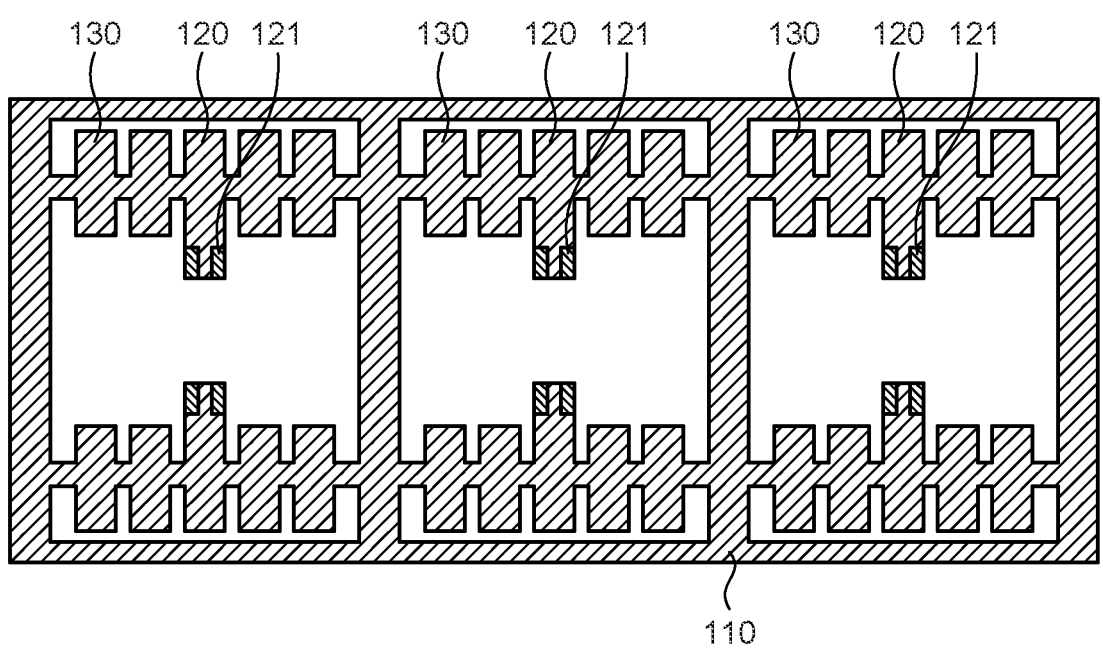
FIG. 7 is a diagram illustrating a specific example of a thin thickness portion forming process.

Then, the thin thickness portions 121 are formed on the central-side end portions of the support bars 120 (Step S102). Specifically, as illustrated in FIG. 7 for example, the thin thickness portions 121 are formed on the central-side end portions of the support bars 120 as a pair in each of the areas enclosed by the frames 110 by press forging, for example.

Meanwhile, formation of the thin thickness portions 121 at Step S102 may be performed at the same time as formation of the frame member at Step S101.

Specifically, for example, when the frame member is formed by performing etching on a metal plate, etching masks are applied on both surfaces of portions that are to be left as the support bars 120, the leads 130, and the tie bars 140, and thereafter, the metal plate is immersed in an etching liquid. In this case, by applying an etching mask on only one side surfaces of portions that are formed into the thin thickness portions 121 of the support bars 120, these portions are subjected to half etching and the thin thickness portions 121 are formed. Further, for example, when the frame member is formed by pressing, it may be possible to form the thin thickness portions 121 by performing forging using a mold that has a certain shape corresponding to the thin thickness portions 121 of the support bars 120.

Figure 8:
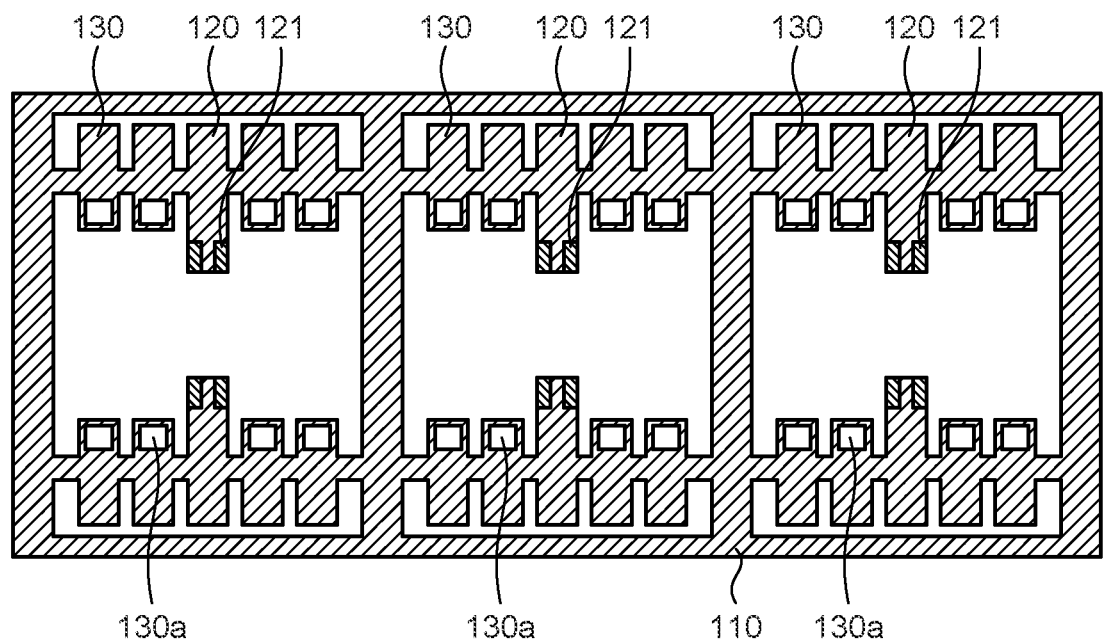
FIG. 8 is a diagram illustrating a specific example of a plating process.

After the thin thickness portions 121 are formed on the support bars 120, the plating layers are formed on the central-side end portions of the leads 130 (Step S103). Specifically, as illustrated in FIG. 8 for example, plating layers 130a are formed on surfaces of the central-side end portions of the leads 130 at a side opposite to a surface bonded to the heat sink 150. The plating layers 130a are formed with, for example, silver plating.

Figure 9:
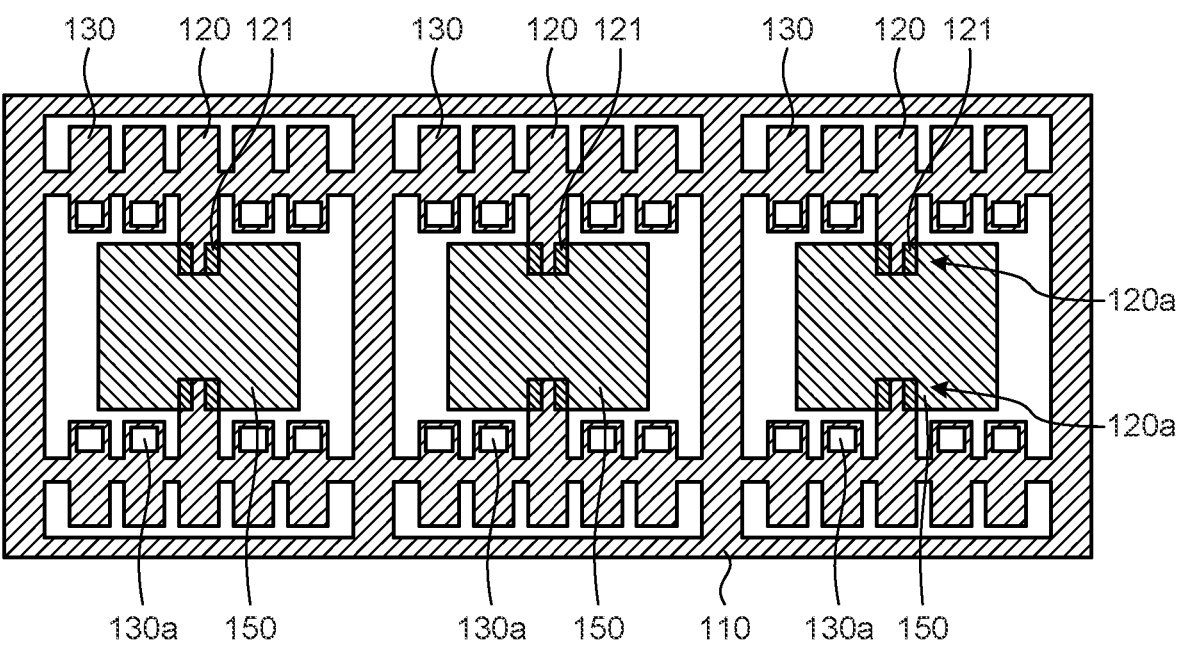
FIG. 9 is a diagram illustrating a specific example of a laser welding process.

Through the processes as described above, the frame member that is made of a copper thin plate is completed. Then, the heat sink 150 that is made of metal, such as copper or a copper alloy, and that has a thickness of 1 mm or more is formed on the frame member by laser welding (Step S104). Specifically, as illustrated in FIG. 9 for example, the heat sink 150 is arranged so as to overlap with the welding portions 120a of the support bars 120, and the heat sink 150 is welded on the support bars 120 by applying laser to the thin thickness portions 121.

As the laser used for the laser welding, for example, green laser or fiber laser may be used. The laser is applied to the thin thickness portions 121 that have small plate thicknesses, and therefore, heat generated by the laser rapidly melts the thin thickness portions 121, so that the support bars 120 and the heat sink 150 are welded together in a short time. Consequently, it is possible to prevent deformation and damage of the support bars 120 and the heat sink 150. Furthermore, because it is possible to prevent deformation and damage of the support bars 120 and the heat sink 150, gaps are not generated in bonded portion between the support bars 120 and the heat sink 150, so that it is possible to improve bonding performance.

Figure 10:
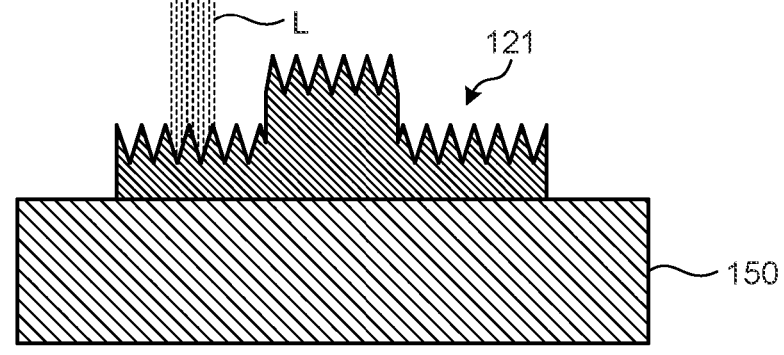
FIG. 10 is a diagram illustrating a specific example of surface treatment on the welding portion.

Meanwhile, when the laser welding is performed, it may be possible to perform a roughening process in advance on surfaces of the support bars 120 to which the laser is to be applied. Specifically, as illustrated in FIG. 10 for example, it may be possible to increase a degree of surface roughness of the surfaces of the support bars 120 including the thin thickness portions 121 by copper rough plating or an anodization process. By roughening the surfaces of the thin thickness portions 121, it is possible to prevent reflection of laser L applied to the thin thickness portions 121, so that laser absorbability is improved and it is possible to effectively perform welding. The degree of surface roughness of the upper surface of the support bars 120 is higher than that of the lower surface of the support bars 120. The degree of surface roughness of the surface of the support bars 120 at which the laser is applied is higher than that of the surface of the support bars 120 opposite to the heat sink 105.

In this manner, the lead frame 100 is formed by welding the heat sink 150 on the thin thickness portions 121 of the support bars 120 by laser welding. A semiconductor chip is mounted on the lead frame 100, and the semiconductor chip is encapsulated by mold resin, such as epoxy resin, for example. Further, the support bars 120 and the leads 130 are cut off from the frame 110, so that a semiconductor device is obtained.

Figure 11A:
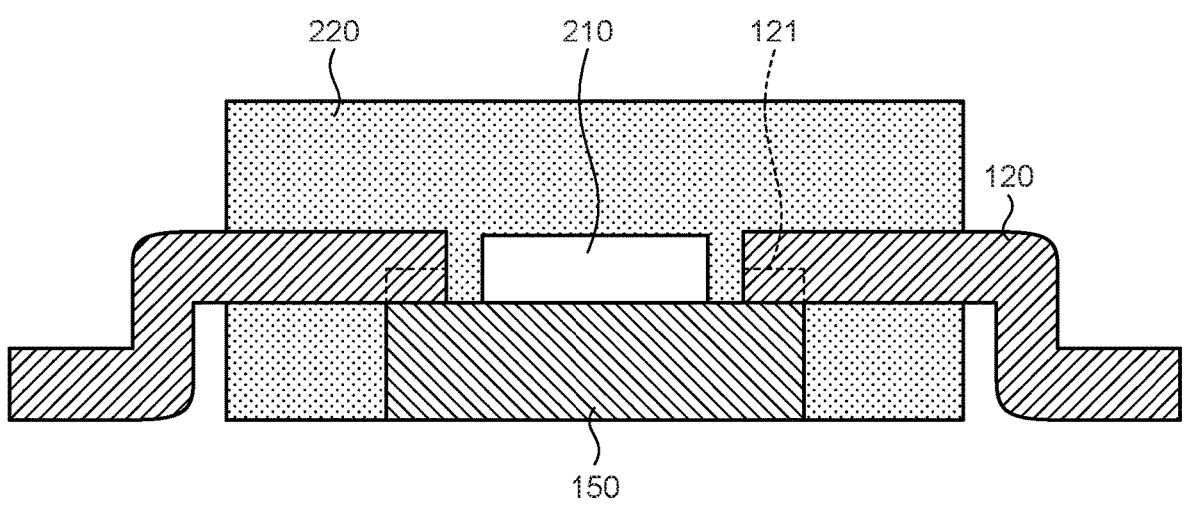
FIGS. 11A and 11B are diagrams illustrating a specific example of a configuration of a semiconductor device.
Figure 11B:
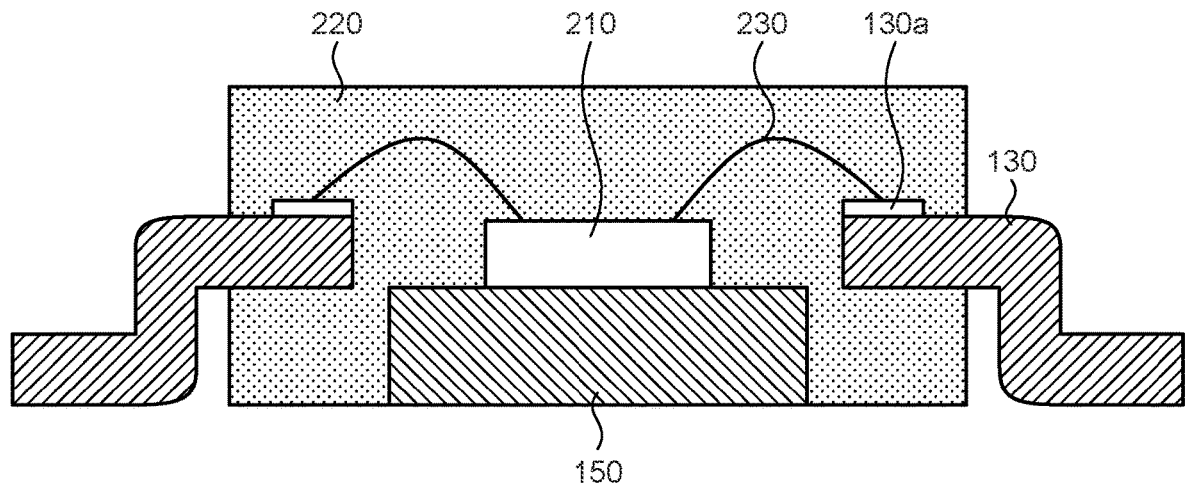

FIGS. 11A and 11B are diagrams illustrating a specific example of a configuration of the semiconductor device. FIG. 11A illustrates a cross section of the semiconductor device at a position along the support bars 120, and FIG. 11B illustrates a cross section of the semiconductor device at a position along the leads 130.

As illustrated in FIGS. 11A and 11B, a semiconductor chip 210 is mounted on the mounting surface 150a of the heat sink 150, and the semiconductor chip 210 and the leads 130 are connected by wire bonding. Specifically, an electrode of the semiconductor chip 210 and the plating layers 130a of the leads 130 are connected by wires 230. Further, the semiconductor chip 210 is encapsulated by a mold resin 220. At this time, a surface of the heat sink 150 opposite to the mounting surface 150a is exposed from a lower surface of the mold resin 220, and therefore is able to efficiently dissipate heat generated by the semiconductor chip 210 mounted on the mounting surface 150a.

The central-side end portions of the support bars 120 in which the thin thickness portions 121 are formed are encapsulated, by mold resin 220, together with the semiconductor chip 210, and other end portions of the support bars 120 protrude from side surfaces of the mold resin 220 and are bent so as to have the same shapes as the leads 130. In this manner, the support bars 120 that are bent so as to have the same shapes as the leads 130 may be used as leads for ground wiring. By using the support bars 120 as the leads for ground wiring, the heat sink 150 may be used as a ground potential. In contrast, the central-side end portions of the leads 130 that are connected to the semiconductor chip 210 in the plating layers 130a are encapsulated, by the mold resin 220, together with the semiconductor chip 210, and other end portions of the leads 130 protrude from the side surfaces of the mold resin 220 and are bent. The end portions of the leads 130 that protrude from the mold resin 220 can be connected to different parts, such as a wiring substrate, for example. In other words, the leads 130 are used as leads for signal wiring, for example.

As described above, according to the present embodiment, the thin thickness portions that have smaller plate thicknesses than other portions are formed in the frame member that is made of a metal plate, and the heat sink that has a larger plate thickness than the frame member is bonded to the thin thickness portions by laser welding. Therefore, heat generated by the laser rapidly melts the thin thickness portions such that the frame member and the heat sink are welded together, so that it is possible to reduce a laser application time. As a result, it is possible to prevent heat of the laser from being transmitted to the vicinities of the thin thickness portions, and it is possible to prevent unnecessary deformation and damage due to welding.

Meanwhile, in one embodiment as described above, the lead frame 100 that is used for a small outline package (SOP) type semiconductor device in which the leads 130 protrude in two directions from the mold resin 220 has been explained. However, it may be possible to apply the same lead frame 100 as one embodiment as described above to a quad flat package (QFP) type semiconductor device in which the leads 130 protrude in four directions from the mold resin 220.

Furthermore, it may be possible to apply the same lead frame 100 as one embodiment as described above to a small outline non-leaded package (SON) type or a quad flat non-leaded package (QFN) type semiconductor device in which the leads 130 do not protrude from the mold resin 220.

Figures 12A, 12B:
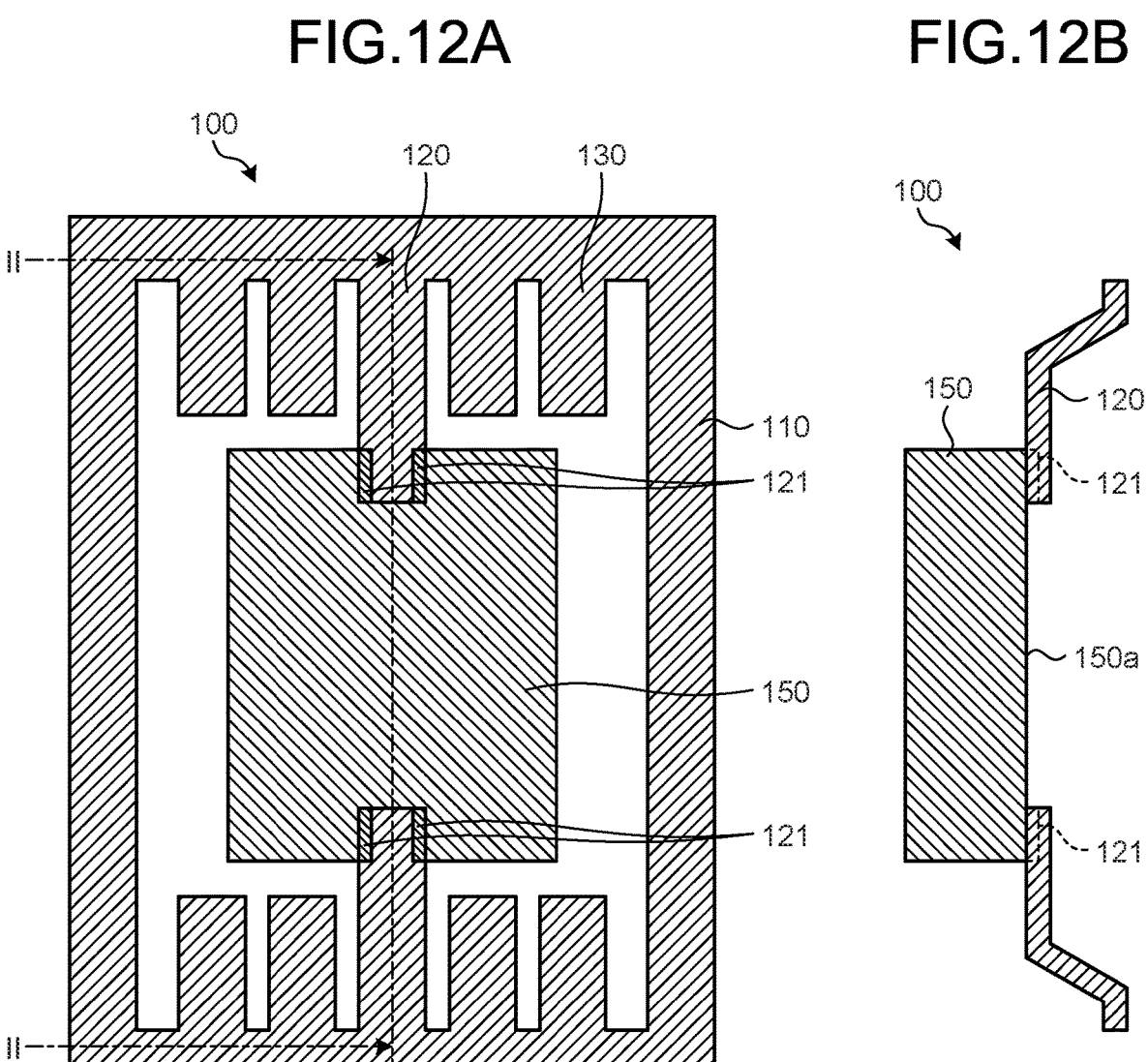
FIGS. 12A and 12B are diagrams illustrating a configuration of a lead frame according to another embodiment.

FIGS. 12A and 12B are diagrams illustrating a configuration of the lead frame 100 used in an SON-type semiconductor device. FIG. 12A is a plan view of the lead frame 100, and FIG. 12B is a cross-sectional view taken along a line II-II in FIG. 12A.

In the lead frame 100 illustrated in FIGS. 12A and 12B, the support bars 120 and the leads 130 extend from short sides of the frame 110, along the longitudinal direction of the lead frame 100. The thin thickness portions 121 are formed on the central-side end portions of the support bars 120, and the heat sink 150 is welded to the thin thickness portions 121. The heat sink 150 is welded to the support bars 120 by the mounting surface 150a on which the semiconductor chip is mounted. Further, the support bars 120 and the leads 130 are bent, and end portions opposite to the central-side end portions are located at positions serving as external terminals of the semiconductor device.

Even in the lead frame 100 as described above, the thin thickness portions 121 are formed in the central-side end portions of the support bars 120, so that when the heat sink 150 is welded to the support bars 120 by laser welding, heat generated by the laser rapidly melts the thin thickness portions such that the frame member and the heat sink are welded together, so that it is possible to reduce a laser application time. As a result, it is possible to prevent heat of the laser from being transmitted to the vicinities of the thin thickness portions, and it is possible to prevent unnecessary deformation and damage due to welding.

Figure 13A:
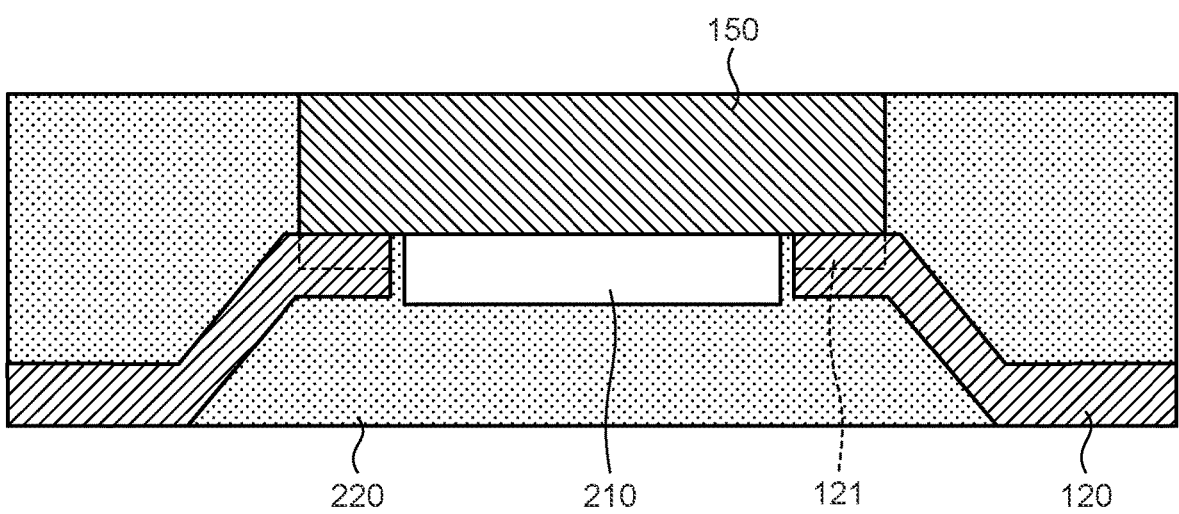
FIGS. 13A and 13B are diagrams illustrating another specific example of the configuration of the semiconductor device.
Figure 13B:
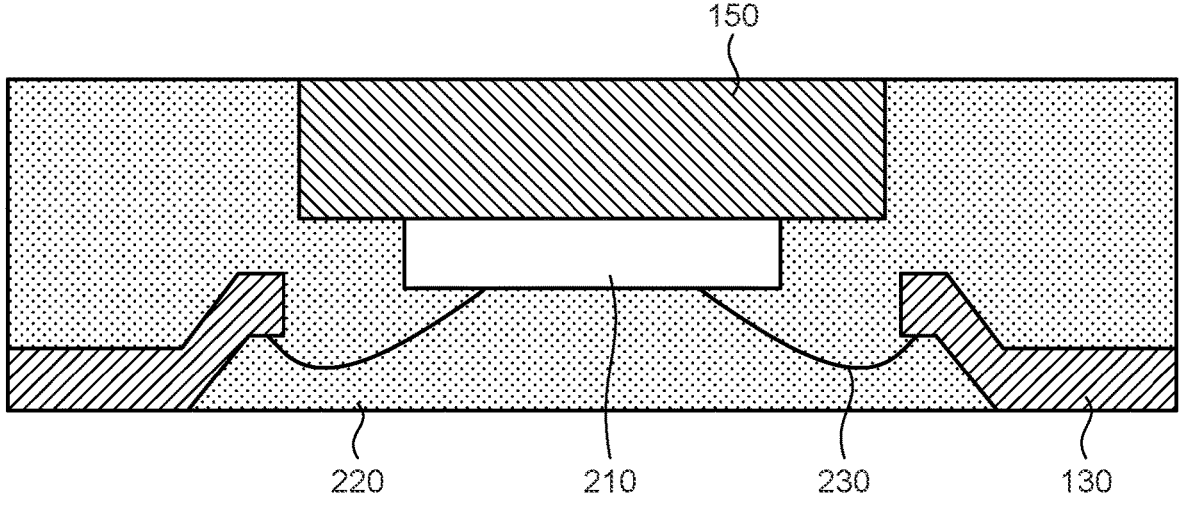

FIGS. 13A and 13B are diagrams illustrating a specific example of a configuration of a SON-type semiconductor device. FIG. 13A illustrates a cross section of the semiconductor device at a position along the support bars 120, and FIG. 13B illustrates a cross-section of the semiconductor device at a position along the leads 130.

As illustrated in FIGS. 13A and 13B, the semiconductor chip 210 is mounted on the mounting surface 150a of the heat sink 150, and the semiconductor chip 210 and the leads 130 are connected by wire bonding. Specifically, the electrode of the semiconductor chip 210 and the leads 130 are connected by the wires 230. Further, the semiconductor chip 210 is encapsulated by the mold resin 220. At this time, the surface of the heat sink 150 opposite to the mounting surface 150a is exposed from an upper surface of the mold resin 220, and therefore is able to efficiently dissipate heat generated by the semiconductor chip 210 mounted on the mounting surface 150a.

Furthermore, the support bars 120 on which the thin thickness portions 121 are formed and the leads 130 are encapsulated, by the mold resin 220, together with the semiconductor chip 210, and end portions of the support bars 120 and the leads 130 opposite to the central-side end portions are exposed from the side surfaces and the lower surface of the mold resin 220. The end portions of the leads 130 are exposed from the mold resin 220, so that the end portions serve as external terminals for connecting the semiconductor device to other components, such as a wiring substrate, for example.

In this manner, with use of the lead frame 100 as described above, it is possible to form a SON-type or QFN-type semiconductor device in which the leads 130 do not protrude from the mold resin 220.

In one embodiment as described above, the residual portion 122 is located in the center of each of the welding portions 120a of the support bars 120, and the thin thickness portions 121 are formed on the both sides of the residual portion 122. However, the shapes of the support bars 120 are not limited to this example.

Figure 14A:
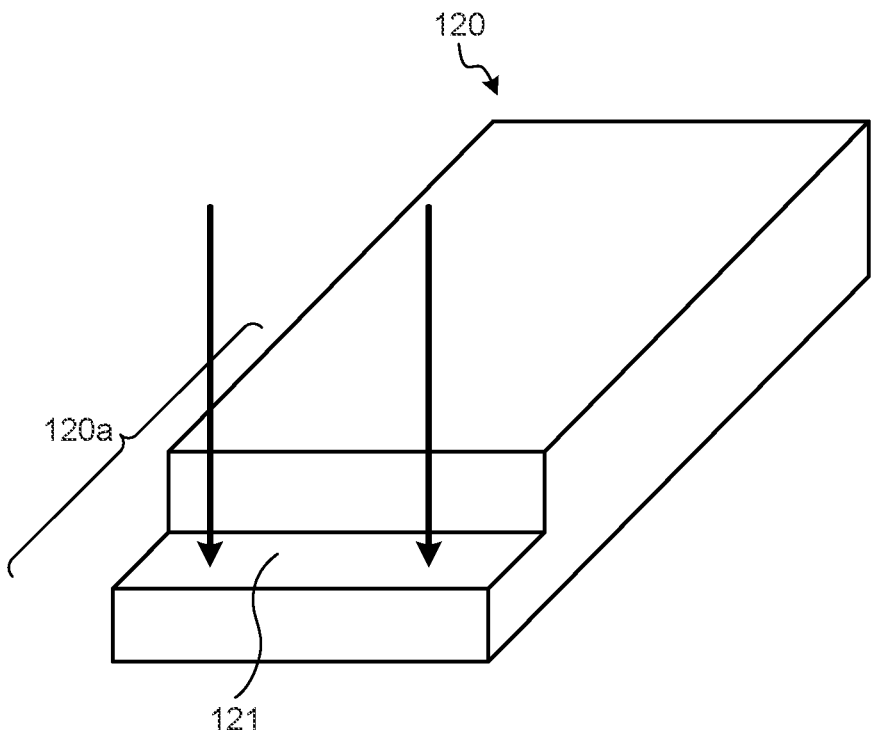
FIGS. 14A and 14B are perspective views illustrating a welding portion according to a modification.

For example, as illustrated in FIG. 14A, the thin thickness portion 121 may be formed by cutting a tip end of the central-side end portion of the support bar 120. Specifically, in the example illustrated in FIG. 14A, the thin thickness portion 121 is formed by cutting an entire tip end of the central-side end portion of the support bar 120 in the width direction. In this case, as indicated by straight arrows in FIG. 14A, laser may be applied to two positions in the single thin thickness portion 121 such that the support bar 120 and the heat sink 150 are welded together. In this manner, by adopting a simple structure in which the thin thickness portion 121 is formed by cutting the tip end of the support bar 120, it is possible to form the lead frame 100 by a simple process.

Figure 14B:
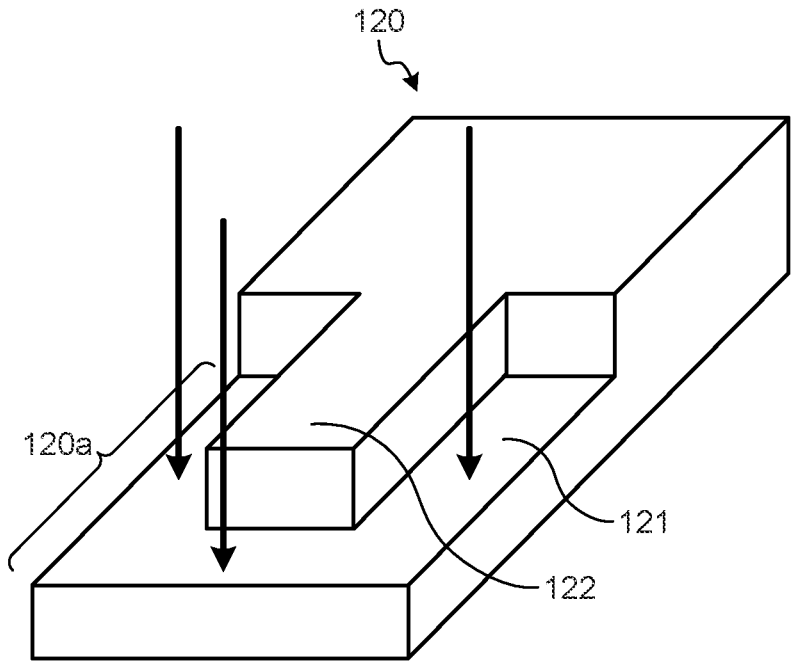

Furthermore, as illustrated in FIG. 14B, it may be possible to leave the residual portion 122 in the center of the welding portion 120a of the support bar 120, and form the thin thickness portions 121 on three sides of the residual portion 122. In this case, as indicated by straight arrows in FIG. 14B, it may be possible to apply laser to a single position in each of the thin thickness portions 121 on the three sides of the residual portion 122 such that the support bars 120 and the heat sink 150 are welded together. In this manner, by forming the thin thickness portions 121 on the three sides of the residual portion 122, it is possible to increase the number of welding positions and improve bonding reliability between the lead frame 100 and the heat sink 150.

Figure 15A:
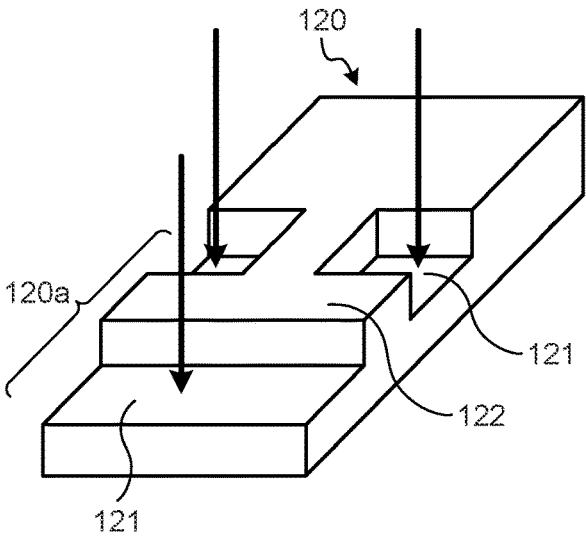
FIGS. 15A, 15B and 15C are perspective views of a welding portion according to another modification.
Figure 15B:
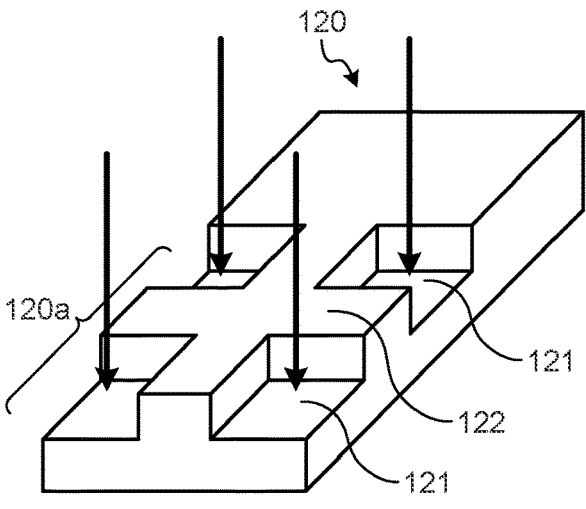

Moreover, the thin thickness portion 121 may be divided into the plurality of thin thickness portions 121 by the residual portion 122. Specifically, the thin thickness portion 121 may be divided into three parts by leaving the residual portion 122 in a T-shape in the welding portion 120a in a planer view as illustrated in FIG. 15A for example, or the thin thickness portion 121 may be divided into four parts by leaving the residual portion 122 in a cross shape in the welding portion 120a in a planer view as illustrated in FIG.

9

Figure 15C:
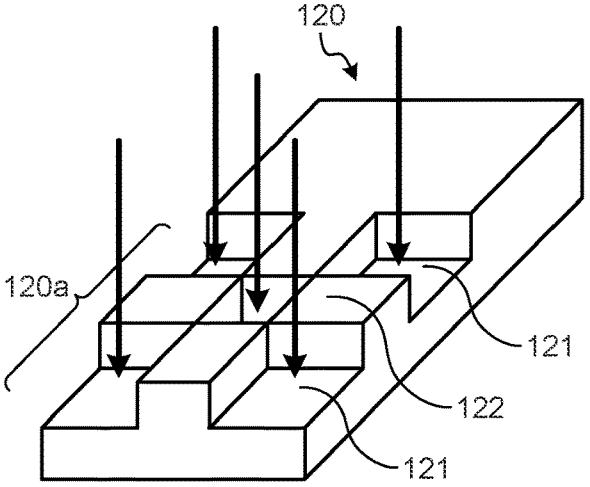

15B. Furthermore, as illustrated in FIG. 15C, the thin thickness portion 121 may be divided into five parts by leaving the residual portion 122 in a lattice shape in the welding portion 120a in a planar view.

In the welding portions 120a as described above, as indicated by straight arrows in the figures, it may be possible to apply laser to a single position in each of the thin thickness portions 121 such that the support bars 120 and the heat sink 150 are welded together. In this manner, by dividing the thin thickness portion 121 into a plurality of parts, it is possible to increase the number of welding positions and improve bonding reliability between the lead frame 100 and the heat sink 150. Furthermore, the thin thickness portions 121 are separated by the residual portion 122, so that it is possible to clarify the welding positions to which the laser is to be applied, and it is possible to improve welding operability.

Moreover, the residual portion 122 may be left at the tip end of the welding portion 120a. Specifically, for example, it may be possible to form the thin thickness portion 121 on a rear side relative to the tip end of the support bar 120 as illustrated in FIG. 16A, or it may be possible to divide the thin thickness portion 121 that is formed on the rear side relative to the tip end of the support bar 120 into two parts by the residual portion 122 as illustrated in FIG. 16B.

In the welding portions 120a as described above, as indicated by straight arrows in the figures, laser is applied to the thin thickness portions 121 such that the support bars 120 and the heat sink 150 are welded together. Furthermore, the residual portion 122 with a flat surface remains in the tip end of the support bar 120, so that it is possible to perform wire bonding for connecting the wire 230 from the electrode of the semiconductor chip 210 to the residual portion 122.

Figure 16A:
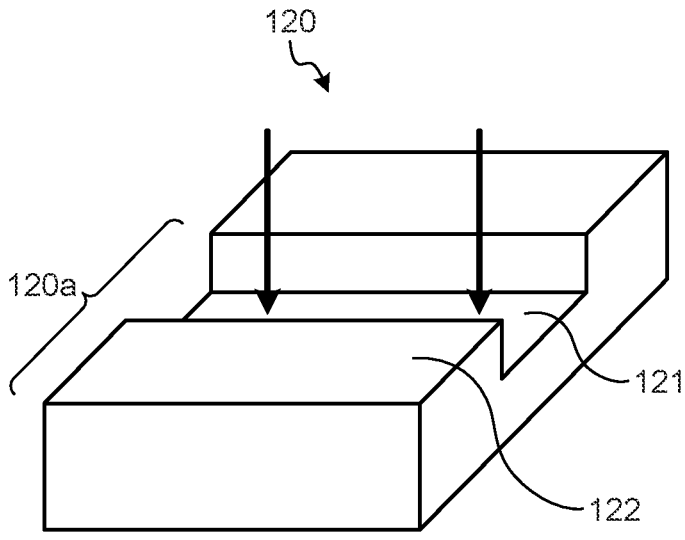
FIGS. 16A and 16B are perspective views illustrating a welding portion according to still another modification.
Figure 16B:
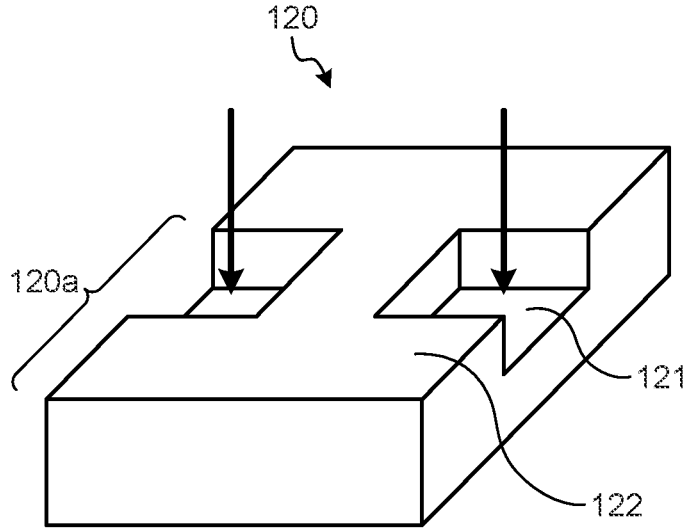
Figure 17:
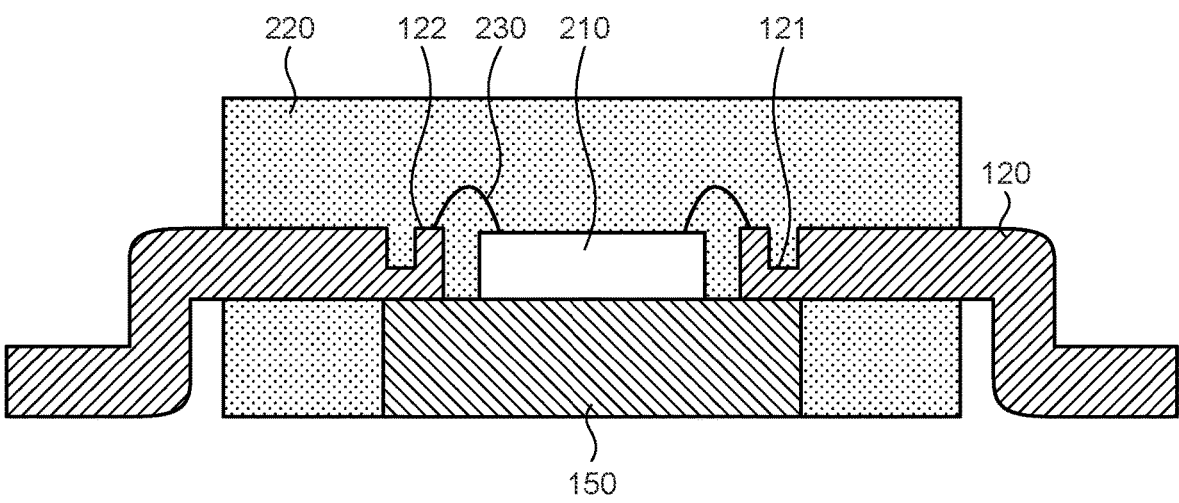
FIG. 17 is a diagram illustrating a specific example of a configuration of a semiconductor device.

FIG. 17 is a diagram illustrating a specific example of a configuration of the welding portion 120a illustrated in FIG. 16A. FIG. 17 illustrates a cross section of the semiconductor device at a position along the support bars 120. As illustrated in FIG. 17, the semiconductor chip 210 is mounted on the mounting surface 150a of the heat sink 150, and the semiconductor chip 210 and the support bars 120 are connected by wire bonding. In other words, the electrode of the semiconductor chip 210 and the residual portions 122 of the support bars 120 are connected by the wires 230. It may be possible to provide the plating layers by using the wire bonding of the support bars 120. In this manner, the support bars 120 are connected to the semiconductor chip 210, so that the support bars 120 may be used as leads for ground wiring.

Meanwhile, it may be possible to form a through hole that penetrates through the residual portion 122 in the support bars 120, in addition to forming the thin thickness portions 121. If the through hole is formed, it is possible to adopt the through hole as a welding portion, in addition to the thin thickness portions 121.

Figure 18A:
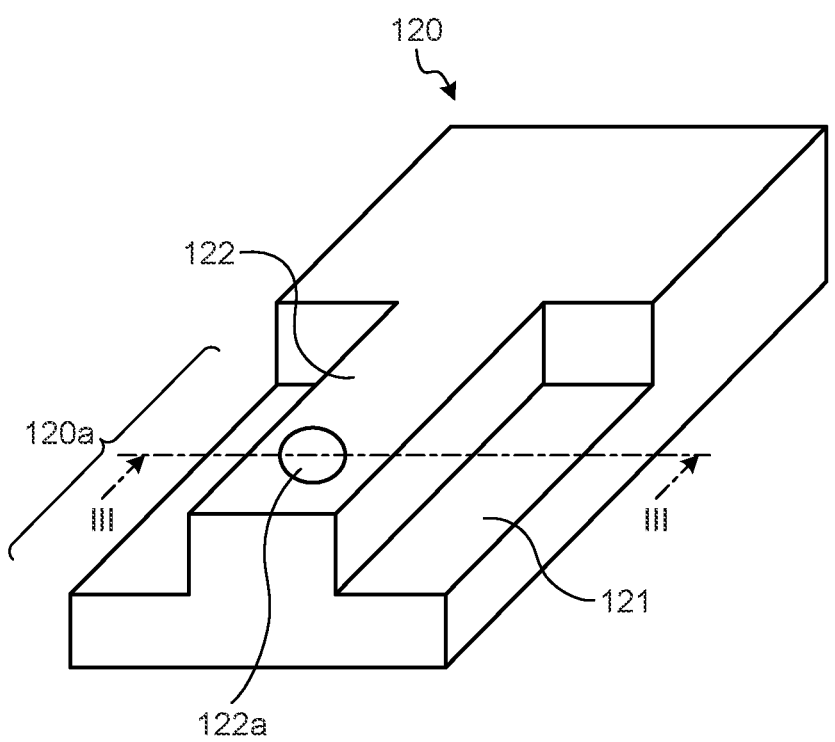
FIGS. 18A and 18B are diagrams illustrating a configuration of a welding portion according to another embodiment.
Figure 18B:
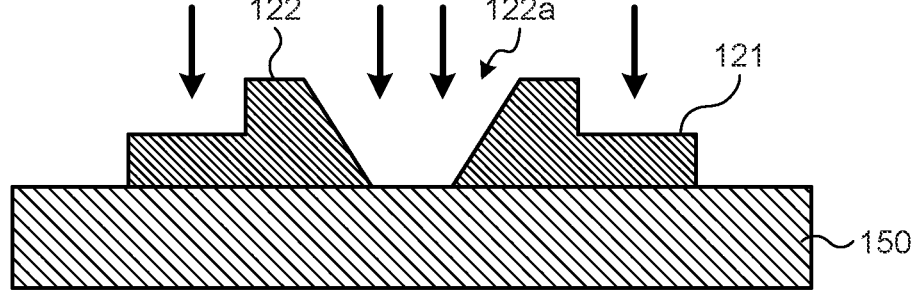

FIGS. 18A and 18B are diagrams illustrating a configuration of the welding portion 120a in which a through hole is formed. FIG. 18A is a perspective view of the welding portion 120a, and FIG. 18B is a diagram illustrating a cross section taken along a line III-III in FIG. 18A.

As illustrated in FIG. 18A, a through hole 122a that penetrates through the support bar 120 in a thickness direction is formed in the residual portion 122 that remains in the center of the support bar 120 in the width direction. Further, as illustrated in FIG. 18B, the through hole 122a has a truncated cone shape with a tapered-shape cross section, where an inner surface of the through hole 122a serves as a welding portion in addition to the thin thickness portions 121 arranged on the both sides of the residual portion 122 as indicated by straight arrows in the figure, and the support bars 120 and the heat sink 150 are welded together.

The mounting surface 150a of the heat sink 150 is exposed from a bottom surface of the through hole 122a; therefore, in laser welding at the through hole 122a, it is possible to fully bond the support bar 120 and the heat sink 150 by applying laser to the inner surface of the through hole 122a for a short time. Therefore, by adopting the thin thickness portions 121 and the inner surface of the through hole 122a as the welding portions, it is possible to prevent heat of the laser from being transmitted to the vicinities of the welding portions, so that it is possible to prevent unnecessary deformation and damage due to welding.

The disclosed technology has been conceived in view of the foregoing situation, and an object of the disclosed technology is to provide a lead frame, a semiconductor device, and a lead frame manufacturing method capable of preventing unnecessary deformation and damage due to welding.

According to one embodiment of the lead frame, the semiconductor device, and the lead frame manufacturing method disclosed in the present application, it is possible to prevent unnecessary deformation and damage due to welding.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A lead frame manufacturing method comprising:
   forming, from a metal plate, a frame member that includes a pair of support portions and a lead, the pair of support portions extending so that ends of the pair of support portions face each other, each of the ends of the pair of support portions having a first part and a second part that has a smaller thickness than the first part, the lead being shorter in length than each of the pair of support portions; and
   welding a heat sink to the pair of support portions in the second part of each of the pair of support portions so that the heat sink does not overlap with the lead in a plan view of the lead frame.

2. The lead frame manufacturing method according to 1, wherein the welding is laser welding.

3. The lead frame manufacturing method according to claim 1, wherein each of the pair of support portions includes a first surface and a second surface, the second part being formed of a recess formed on the first surface.

4. The lead frame manufacturing method according to claim 3, wherein the second surface of the second part of the support portion is welded to one surface of the heat sink.

5. The lead frame manufacturing method according to 1, wherein
   the forming includes forming the frame member that further includes a frame, and
   the pair of support portions extends, in a center of the frame in a second direction orthogonal to a first direction, from both ends of the frame in the first direction to a center of the frame in the first direction so that the ends of the pair of support portions face each other.

6. The lead frame manufacturing method according to 1, wherein the pair of support portions are a pair of ground wiring leads having the ends and another ends opposite to the ends, each of the ends of the pair of the ground wiring leads has the first part and the second part, the first part and the another ends have a same thickness, and the another ends are external terminals.

7. A lead frame manufacturing method comprising:

forming, from a metal plate, a frame member that includes a pair of support portions and a lead, the pair of support portions extending so that ends of the pair of support portions face each other, each of the ends of the pair of support portions having a first part and a second part that has a smaller thickness than the first part; and welding a heat sink to the pair of support portions in the second part of each of the pair of support portions, wherein the forming includes forming the frame member that further includes a rectangular frame, and the pair of support portions extends, in a center of the rectangular frame in a short-side direction, from both ends of the rectangular frame in a longitudinal direction to a center of the rectangular frame in the longitudinal direction so that the ends of the pair of support portions face each other.

8. The lead frame manufacturing method according to 7, wherein the welding is a laser welding.

9. The lead frame manufacturing method according to claim 7, wherein each of the pair of support portions includes a first surface and a second surface, the second part being formed of a recess formed on the first surface.

10. The lead frame manufacturing method according to claim 9, wherein the second surface of the second part of the support portion is welded to one surface of the heat sink.

11. The lead frame manufacturing method according to 7, wherein the pair of support portions are a pair of ground wiring leads having the ends and another ends opposite to the ends, each of the ends of the pair of the ground wiring leads has the first part and the second part, the first part and the another ends have a same thickness, and the another ends are external terminals.

* * * * *